United States Patent
Kim et al.

(10) Patent No.: US 11,765,885 B2
(45) Date of Patent: Sep. 19, 2023

(54) SEMICONDUCTOR DEVICES INCLUDING A BURIED GATE ELECTRODE

(71) Applicant: SAMSUNG ELECTRONICS CO., LTD., Suwon-si (KR)

(72) Inventors: Hyewon Kim, Changwon-si (KR); Juhyung We, Hwaseong-si (KR); Sungmi Yoon, Seoul (KR); Donghyun Im, Yongin-si (KR); Sangwoon Lee, Seongnam-si (KR); Taiuk Rim, Suwon-si (KR); Kyosuk Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 17/210,931

(22) Filed: Mar. 24, 2021

(65) Prior Publication Data
US 2022/0037328 A1 Feb. 3, 2022

(30) Foreign Application Priority Data
Jul. 29, 2020 (KR) .......................... 10-2020-0094372

(51) Int. Cl.
*H10B 12/00* (2023.01)
*H01L 21/28* (2006.01)
(Continued)

(52) U.S. Cl.
CPC ....... *H10B 12/34* (2023.02); *H01L 21/28044* (2013.01); *H01L 29/1037* (2013.01);
(Continued)

(58) Field of Classification Search
CPC ......... H01L 27/10823; H01L 27/10876; H01L 29/4236; H01L 29/1037; H01L 21/28044;
(Continued)

(56) References Cited

U.S. PATENT DOCUMENTS 8,278,201 B2 * 10/2012 Jang ..................... H10B 12/488
438/270
8,563,413 B2 10/2013 Han
(Continued)

FOREIGN PATENT DOCUMENTS

KR 10-1132801 B1 4/2012

*Primary Examiner* — Nicholas J Tobergte
*Assistant Examiner* — William Henry Anderson
(74) *Attorney, Agent, or Firm* — Lee IP Law, P.C.

(57) ABSTRACT

A semiconductor device including a substrate including a recess; a gate insulation layer on a surface of the recess; a first gate pattern on the gate insulation layer and filling a lower portion of the recess; a second gate pattern on the first gate pattern in the recess and including a material having a work function different from a work function of the first gate pattern; a capping insulation pattern on the second gate pattern and filling an upper portion of the recess; a leakage blocking oxide layer on the gate insulation layer at an upper sidewall of the recess above an upper surface of the first gate pattern and contacting a sidewall of the capping insulation pattern; and impurity regions in the substrate and adjacent to the upper sidewall of the recess, each impurity region having a lower surface higher than the upper surface of the first gate pattern.

14 Claims, 10 Drawing Sheets

(51) Int. Cl.
  *H01L 29/423* (2006.01)
  *H01L 29/10* (2006.01)
  *H01L 29/78* (2006.01)

(52) U.S. Cl.
  CPC ...... *H01L 29/4236* (2013.01); *H01L 29/7834* (2013.01); *H10B 12/053* (2023.02); *H10B 12/315* (2023.02)

(58) Field of Classification Search
  CPC ..... H01L 2221/1073; H01L 2221/1084; H01L 2221/1089; H01L 21/76849; H01L 21/7685; H01L 21/76852; H01L 21/76871; H01L 21/02362; H01L 27/10814; H01L 27/10885; H01L 27/10891; H01L 29/4232; H01L 29/42364; H01L 29/42368; H01L 21/28255; H01L 29/1033; H01L 21/28247; H01L 29/0603; H01L 29/0607; H01L 29/0615; H01L 29/0684
  See application file for complete search history.

(56) References Cited

U.S. PATENT DOCUMENTS

| | | |
|---|---|---|
| 9,136,270 B2 | 9/2015 | Kim et al. |
| 9,437,697 B2 | 9/2016 | Cho |
| 10,304,684 B2 | 5/2019 | Jang et al. |
| 10,734,394 B2* | 8/2020 | Liu .................... H01L 29/40114 |
| 2013/0256770 A1* | 10/2013 | Huh ........................ H01L 27/04 |
| | | 257/334 |
| 2014/0264568 A1 | 9/2014 | Kim et al. |
| 2016/0172488 A1* | 6/2016 | Oh ........................ H10B 63/30 |
| | | 257/330 |
| 2019/0088657 A1* | 3/2019 | Im .......................... H10B 12/34 |
| 2019/0259839 A1 | 8/2019 | Ryu |
| 2020/0043799 A1* | 2/2020 | Lee .................... H01L 21/76897 |
| 2021/0066466 A1* | 3/2021 | Kwon ................. H01L 29/4238 |

* cited by examiner

SEMICONDUCTOR DEVICES INCLUDING A BURIED GATE ELECTRODE

CROSS-REFERENCE TO RELATED APPLICATION

Korean Patent Application No. 10-2020-0094372, filed on Jul. 29, 2020, in the Korean Intellectual Property Office, and entitled: "Semiconductor Devices," is incorporated by reference herein in its entirety.

BACKGROUND

1. Field

Embodiments relate to semiconductor devices.

2. Description of the Related Art

In a buried channel array transistor (BCAT), a gate structure may be formed in a recess of a substrate so that the gate structure may be buried in the substrate.

SUMMARY

The embodiments may be realized by providing a semiconductor device including a substrate including a recess; a gate insulation layer on a surface of the recess; a first gate pattern on the gate insulation layer, the first gate pattern filling a lower portion of the recess; a second gate pattern on the first gate pattern in the recess, the second gate pattern including a material having a work function different from a work function of the first gate pattern; a capping insulation pattern on the second gate pattern, the capping insulation pattern filling an upper portion of the recess; a leakage blocking oxide layer on the gate insulation layer at an upper sidewall of the recess above an upper surface of the first gate pattern, the leakage blocking oxide layer contacting a sidewall of the capping insulation pattern; and impurity regions in the substrate and adjacent to the upper sidewall of the recess, each of the impurity regions having a lower surface higher than the upper surface of the first gate pattern.

The embodiments may be realized by providing a semiconductor device including a substrate including a recess; a gate insulation layer on a surface of the recess; a first gate pattern on the gate insulation layer, the first gate pattern filling a lower portion of the recess; a second gate pattern on the first gate pattern in the recess, the second gate pattern including polysilicon doped with impurities; a leakage blocking oxide layer on a portion of the gate insulation layer above an upper surface of the second gate pattern, and also on the upper surface of the second gate pattern; a capping insulation pattern on the leakage blocking oxide layer, the capping insulation pattern filling an upper portion of the recess; and impurity regions in the substrate adjacent to an upper sidewall of the recess, each of the impurity regions having a lower surface higher than an upper surface of the first gate pattern.

The embodiments may be realized by providing a semiconductor device including a substrate including an isolation region and an active region; a recess in the substrate, and the recess extending in a first direction; a gate insulation layer on a surface of the recess; a first gate pattern on the gate insulation layer, the first gate pattern filling a lower portion of the recess; a second gate pattern on the first gate pattern in the recess, the second gate pattern including a material having a work function different from a work function of the first gate pattern; a capping insulation pattern on the second gate pattern, the capping insulation pattern filling an upper portion of the recess; a leakage blocking oxide layer on a portion of the gate insulation layer on an upper sidewall of the recess above an upper surface of the first gate pattern, the leakage blocking oxide layer contacting at least a sidewall of the capping insulation pattern; a first impurity region and a second impurity region in the substrate adjacent to the upper sidewall of the recess, each of the first and second impurity regions having a lower surface higher than the upper surface of the first gate pattern; a bit line structure electrically connected to the first impurity region; and a capacitor electrically connected to the second impurity region.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
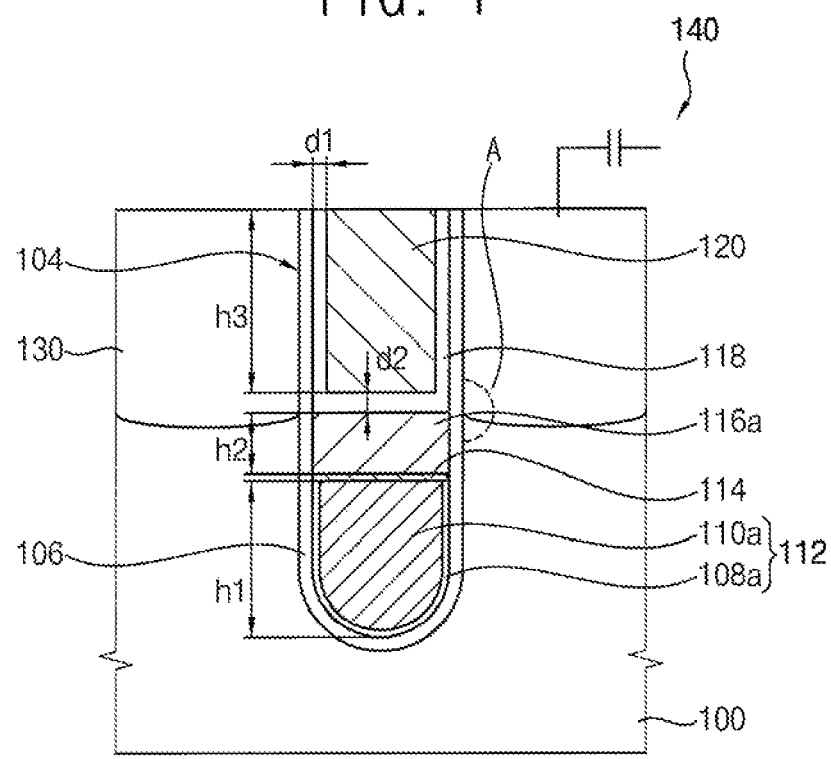
FIG. 1 is a cross-sectional view of a transistor in accordance with example embodiments.

FIG. 1 is a cross-sectional view of a transistor in accordance with example embodiments. The transistor shown in FIG. 1 may be a recessed channel array transistor.

Referring to FIG. 1, a substrate 100 may include a semiconductor material, e.g., silicon, germanium, silicon-germanium, or the like, or a group III-V compound semiconductor, e.g., GaP, GaAs, GaSb, or the like. In an implementation, the substrate 100 may be a silicon-on-insulator (SOI) substrate or a germanium-on-insulator (GOI) substrate. In an implementation, the substrate 100 may include silicon. As used herein, the term "or" is not an exclusive term, e.g., "A or B" would include A, B, or A and B.

The substrate 100 may include a recess 104 at a portion for forming a gate. In an implementation, the recess 104 may extend (e.g., lengthwise) in a first direction parallel to a surface of the substrate.

A gate insulation layer 106 may be conformally formed on a sidewall and a bottom surface of the recess 104. In an implementation, the gate insulation layer 106 may include silicon oxide.

In an implementation, the gate insulation layer 106 may have a constant or uniform thickness from the sidewall and the bottom surface of the recess 104. In an implementation, a thickness of the gate insulation layer 106 may be less than 150 Å. In an implementation, the thickness of the gate insulation layer 106 may be about 30 Å to about 100 Å.

A first gate pattern 112 (filling a lower portion of the recess 104) may be on the gate insulation layer 106. The first gate pattern 112 may include a metal. In an implementation, the first gate pattern 112 may include a barrier metal pattern 108a and a metal pattern 110a.

The barrier metal pattern 108a may be on an upper (e.g., inner) surface of the gate insulation layer 106. The metal pattern 110a may be on the barrier metal pattern 108a to fill the lower portion of the recess 104. In an implementation, the barrier metal pattern 108a may surround sidewalls and bottom surfaces of the metal pattern 110a.

In an implementation, (e.g., a material of) the metal pattern 110a may have a first work function. The first work function may be higher than a work function of a semiconductor material included in the substrate 100. In an implementation, the first work function may be higher than a work function of silicon.

In an implementation, the barrier metal pattern 108a may include, e.g., titanium, titanium nitride, tantalum, tantalum nitride, tungsten nitride, tungsten carbon nitride, or the like. In an implementation, the metal pattern 110a may include, e.g., tungsten, aluminum, copper, or the like. In an implementation, the metal pattern 110a may include tungsten, and in this case, the first work function may be about 4.58 eV.

The first gate pattern 112 may have a first height h1 in a vertical direction from a lowermost surface of the first gate pattern 112 (e.g., adjacent to a bottom of the recess 104) to a top surface of the first gate pattern 112. The first gate pattern 112 may include a metal, so that first gate pattern 112 may have low resistance.

In an implementation, a barrier interface layer 114 may be on an upper surface of the first gate pattern 112. The barrier interface layer 114 may include a metal nitride. In an implementation, the metal nitride may be formed by nitridation of the upper surface of the metal pattern 110a. In an implementation, the barrier interface layer 114 may include tungsten nitride. In an implementation, the barrier interface layer 114 may have a thin thickness of about 10 Å or less. In an implementation, the barrier interface layer 114 may include tungsten nitride. A reaction or mixing between the first gate pattern 112 and a second gate pattern (described below) may be reduced or prevented by the barrier interface layer 114.

The second gate pattern 116a may be on the barrier interface layer 114. The second gate pattern 116a may include a material that is different from a material of the first gate pattern 112.

In an implementation, the second gate pattern 116a may have a second work function different from the first work function. The second gate pattern 116a may be formed so as to decrease a gate induced drain leakage (GIDL). In an implementation, the second work function of the second gate pattern 116a may be substantially similar to or equal to a work function of each of impurity regions 130 serving as source/drains. A difference between the second work function and the work function of each of the impurity regions 130 may be less than a difference between the first work function and the work function of each of the impurity regions 130.

In an implementation, the second gate pattern 116a may include a semiconductor material doped with impurities. In an implementation, the second gate pattern 116a may include polysilicon doped with impurities. The impurities doped in the polysilicon may have a conductivity type the same as a conductivity type of the impurities doped in the impurity region 130.

In an implementation, the second gate pattern 116a may include a metal material having a work function substantially similar to or equal to the work function of the impurity region 130.

In an implementation, the second work function may be lower than the first work function. In an implementation, the second gate pattern 116a may have a resistance higher than a resistance of the first gate pattern 112.

The second gate pattern 116a may have a second height h2 from a bottom surface to an upper surface thereof, and the second height h2 may be less than the first height h1. The first gate pattern 112 having low resistance may have the first height h1 greater than the second height h2 of the second gate pattern 116a, so that a resistance of a gate in a transistor may be decreased.

A leakage blocking oxide layer 118 may be on a surface of the gate insulation layer 106 higher than (e.g., extending upwardly above) an upper surface of the second gate pattern 116a, and also on the upper surface of the second gate pattern 116a.

In an implementation, the leakage blocking oxide layer 118 may have a work function lower than a work function of a capping insulation pattern 120 positioned thereon.

In an implementation, the leakage blocking oxide layer 118 may include, e.g., silicon oxide. In an implementation, the work function of the leakage blocking oxide layer 118 may be substantially similar to or equal to the work function of the gate insulation layer 106.

In an implementation, the leakage blocking oxide layer 118 may include a metal oxide. The metal oxide may include, e.g., hafnium oxide ($HfO_2$), zirconium oxide ($ZrO_2$), aluminum oxide, tantalum oxide, or the like. In an implementation, the work function of the metal oxide may be lower than the work function of the capping insulation pattern 120, and higher than the work function of the gate insulation layer 106.

In an implementation, portions of the leakage blocking oxide layer 118 on the gate insulation layer 106 may have a first thickness d1, and portions of the leakage blocking oxide layer 118 on an upper surface of the second gate pattern 116a may have a second thickness d2 greater than the first thickness d1.

In the transistor, a maximum electric field portion may be a portion of the substrate 100 that is higher than the upper surface of the second gate pattern 116a and adjacent to the second gate pattern 116a. In an implementation, the GIDL defect may be frequently generated at the maximum electric field portion A.

The leakage blocking oxide layer 118 may be on the portion of the gate insulation layer 106 that is higher than or above the upper surface of the second gate pattern 116a. In an implementation, a thickness of a total oxide layer on the upper sidewall of the recess 104 (above the second gate pattern 116a) may be increased. In an implementation, the leakage blocking oxide layer 118 may be on the upper surface of the second gate pattern 116a (e.g., may be between the second gate pattern 116a and the capping insulation pattern 120), and a thickness of an oxide layer between the maximum electric field portion and the second gate pattern 116a may be increased. In an implementation, the GIDL defects may be decreased by the leakage blocking oxide layer 118.

The leakage blocking oxide layer 118 may be on the (e.g., inner) surface of the gate insulation layer 106 and on the upper surface of the second gate pattern 116a adjacent to the maximum electric field portion A, and an electric field in the substrate 100 may be decreased. The GIDL defects of the transistor may be decreased.

The leakage blocking oxide layer 118 may not be on portions of the gate insulation layer 106 under (e.g., deeper in the recess 104 than) the upper surface of the second gate pattern 116a (e.g., may not be on sides of the second gate pattern 116a and may not be between the second gate pattern 116a and the gate insulation layer 106). A sidewall and bottom surface of a structure in which the first gate pattern 112, the barrier interface layer 114, and the second gate pattern 116a are stacked may only contact (e.g., directly contact) the gate insulation layer 106. In an implementation, the GIDL defects of the transistor may be decreased, without increasing a thickness of the gate insulation layer 106.

If a thickness of the portion of the gate insulation layer 106 under the upper surface of the second gate pattern 116a were to increase, an inner width of the recess may be decreased by the gate insulation layer 106. A width of the first gate pattern 112 could be reduced, and the resistance of the first gate pattern 112 may be increased. In addition, the thickness of the gate insulation layer 106 under the upper surface of the second gate pattern 116a may be determined by a target threshold voltage of the transistor, and it may be difficult to increase the thickness of the gate insulation layer 106.

In an implementation, the thickness of the gate insulation layer 106 under the upper surface of the second gate pattern 116a may not be increased, and a resistance of the first gate pattern 112 may be reduced. In an implementation, the transistor may have a target threshold voltage.

The capping insulation pattern 120 may be on the second gate pattern 116a. The capping insulation pattern 120 may completely fill (e.g., remaining portions of) the recess 104. The capping insulation pattern 120 may include, e.g., silicon nitride.

In an implementation, the capping insulation pattern 120 may have a third height h3 from a bottom surface to an upper surface thereof, and the third height h3 may be greater than the second height h2.

The leakage blocking oxide layer 118 may be between the capping insulation pattern 120 and the gate insulation layer 106 and between the capping insulation pattern 120 and the second gate pattern 116a. The leakage blocking oxide layer 118 may surround a sidewall and a bottom surface of the capping insulation pattern 120.

In an implementation, a gate structure including the gate insulation layer 106, the first gate pattern 112, the second gate pattern 116a, the barrier interface layer 114, the leakage blocking oxide layer 118, and the capping insulation pattern 120 may be in the recess 104.

The impurity regions 130 serving as source/drain regions may be in the substrate 100 adjacent to sides of the gate structure. The impurity regions 130 may be at a portion of the substrate adjacent to the upper sidewall of the recess 104.

In an implementation, a lower surface of the impurity region 130 may be higher than the upper surface of the first gate pattern 112. In an implementation, a level of the lower surface of the impurity region 130 may be positioned at or aligned with a portion of a sidewall of the second gate pattern 116a, or the lower surface of the impurity region 130 may be higher than an upper surface of the second gate pattern 116a.

In this case, a difference between the work function of the impurity region 130 and the work function of the second gate pattern 116a may be less than a difference between the work function of the impurity region 130 and the work function of the first gate pattern 112. A potential difference between the impurity region 130 and the second gate pattern 116a adjacent to the impurity region 130 may be reduced, so that the GIDL defect may be decreased at a portion of the substrate 100 between the impurity region 130 and the second gate pattern 116a.

In an implementation, circuits may be electrically connected to the impurity region 130 of the transistor. In an implementation, when the transistor serves as a part of a memory cell in a DRAM device, a capacitor 140 may be electrically connected to one of the impurity regions 130 of the transistor. In an implementation, a bit line may be electrically connected to one of the impurity regions 130 of the transistor.

In an implementation, the transistor may include the leakage blocking oxide layer 118, so that the GIDL defects may be decreased.

FIGS. 2 to 9 are cross-sectional views of stages in a method of manufacturing a transistor in accordance with example embodiments.

Figure 2:
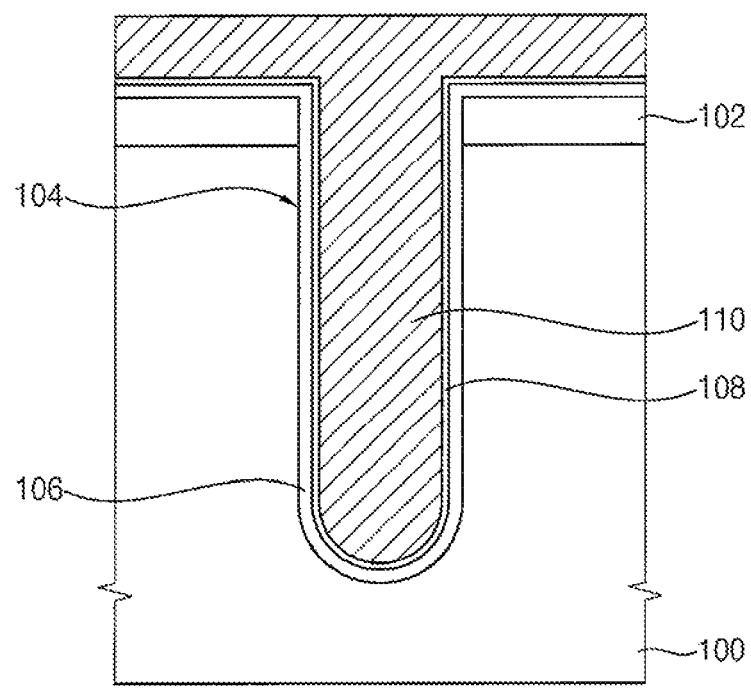
FIGS. 2 to 9 are cross-sectional views of stages in a method of manufacturing a transistor in accordance with example embodiments.

Referring to FIG. 2, a hard mask 102 may be formed on a substrate 100. An upper portion of the substrate 100 may be etched using the hard mask 102 as an etching mask to form a recess 104.

A gate insulation layer 106 may be conformally formed on a (e.g., inner) surface of the recess 104 and on the hard mask 102. The gate insulation layer 106 may include silicon oxide. The silicon oxide may be formed by a thermal oxidation process or an atomic layer deposition process.

In an implementation, the gate insulation layer 106 may have a predetermined thickness from the surface of the recess 104.

A barrier metal layer 108 may be conformally formed on the gate insulation layer 106. In an implementation, the barrier metal layer 108 may include titanium, titanium nitride, tantalum, tantalum nitride, tungsten nitride, tungsten carbon nitride, or the like. A metal layer 110 may be formed on the barrier metal layer 108 to fill the recess 104. The metal layer 110 may include, e.g., tungsten.

Figure 3:
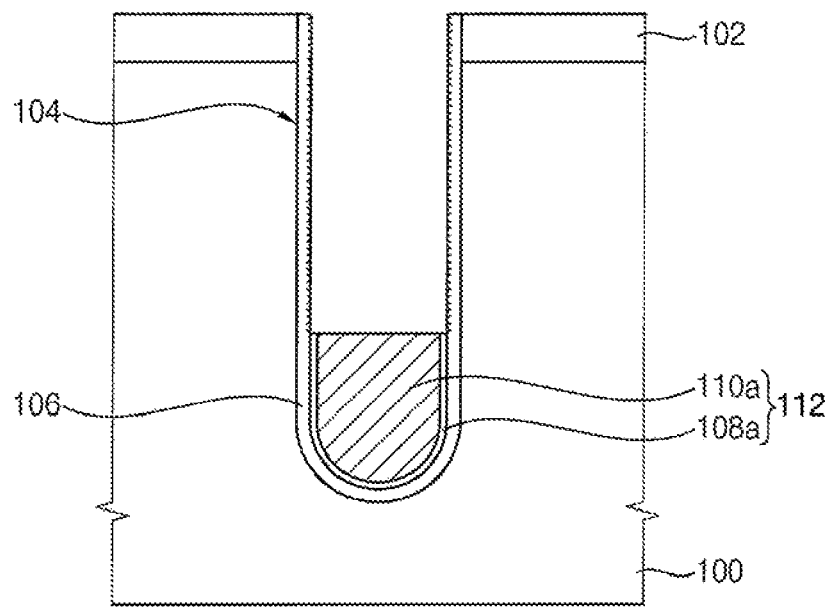

Referring to FIG. 3, the metal layer 110, the barrier metal layer 108, and the gate insulation layer 106 may be planarized until an upper surface of the hard mask 102 may be exposed. The planarization process may include, e.g., a chemical mechanical polishing (CMP) process. The gate insulation layer 106 may be conformally formed on a sidewall and a bottom surface of the recess 104.

Thereafter, the metal layer 110 and the barrier metal layer 108 at an upper portion of the recess 104 may be removed by an etch back process. Thus, a barrier metal pattern 108a and a metal pattern 110a may be formed on the gate insulation layer 106. In the etch back process, the gate insulation layer 106 on the sidewall of the recess 104 may be hardly etched.

The barrier metal pattern 108a and the metal pattern 110a may serve as a first gate pattern 112. The first gate pattern 112 may fill a lower portion or bottom of the recess 104. The first gate pattern 112 may have a first height.

When the etch back process is performed, an exposed surface of the gate insulation layer 106 higher than the first gate pattern 112 may be damaged. Thus, a surface damage portion (refer to a dotted line) may be formed at the exposed surface of the gate insulation layer 106.

The surface damage portion of the gate insulation layer 106 may include dangling bonds and particles.

Figure 4:
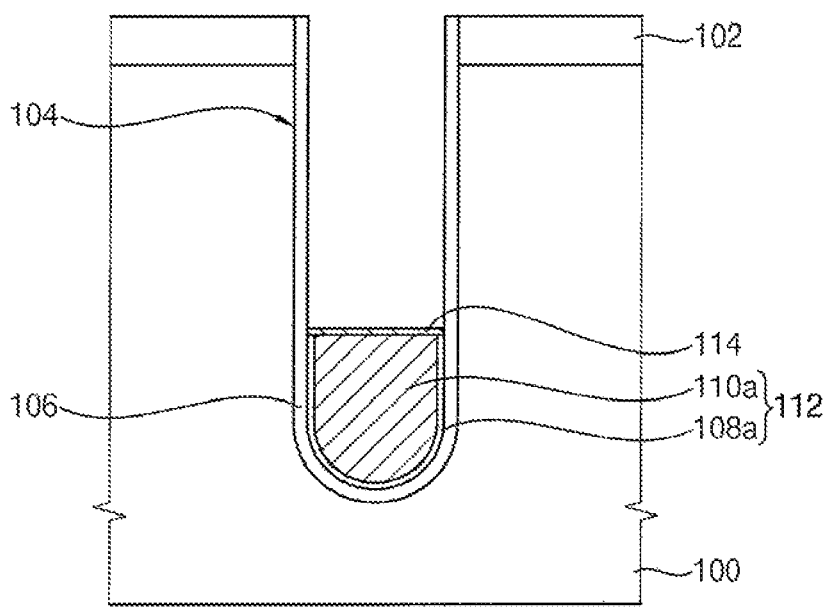

Referring to FIG. 4, the upper surface of the metal pattern 110a may be nitrided to form a barrier interface layer 114 on the upper surface of the first gate pattern 112. The barrier interface layer 114 may include a nitride of a metal included in the metal pattern 110a.

In an implementation, a surface treatment process for curing surface damage of the gate insulation layer 106 may be further performed. In an implementation, the surface treatment process may include supplying oxygen radicals or oxygen gas. In an implementation, the surface treatment process may include a plasma process using oxygen or ozone. The surface treatment process may be performed so that the barrier interface layer 114 and the metal pattern 110a are not oxidized. In the surface treatment process, dangling bonds and particles on the surface of the gate insulation layer 106 may be removed by the oxygen. In an implementation, the surface treatment process may not be performed.

Figure 5:
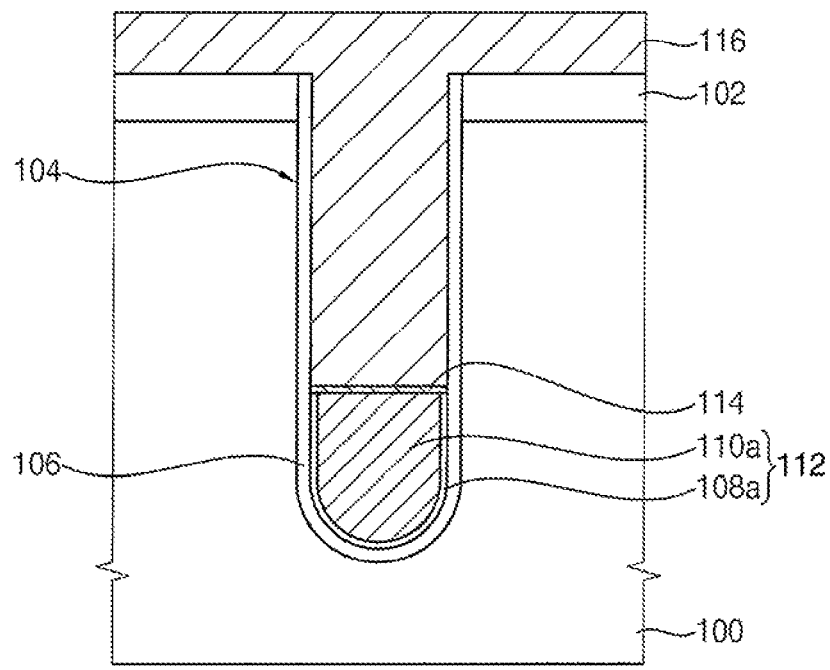

Referring to FIG. 5, a semiconductor layer may be formed on the barrier interface layer 114 and the hard mask 102 to fill the recess 104. In an implementation, the semiconductor layer may include a polysilicon layer 116 doped with impurities. Hereinafter, the semiconductor layer is described as the polysilicon layer 116.

In an implementation, the impurities may be doped by in-situ doping during a deposition process of the polysilicon layer 116. The impurities doped in the polysilicon layer 116 may have a conductivity type the same as a conductivity type of the impurities doped in impurity regions serving as source/drain regions of a transistor.

Figure 6:
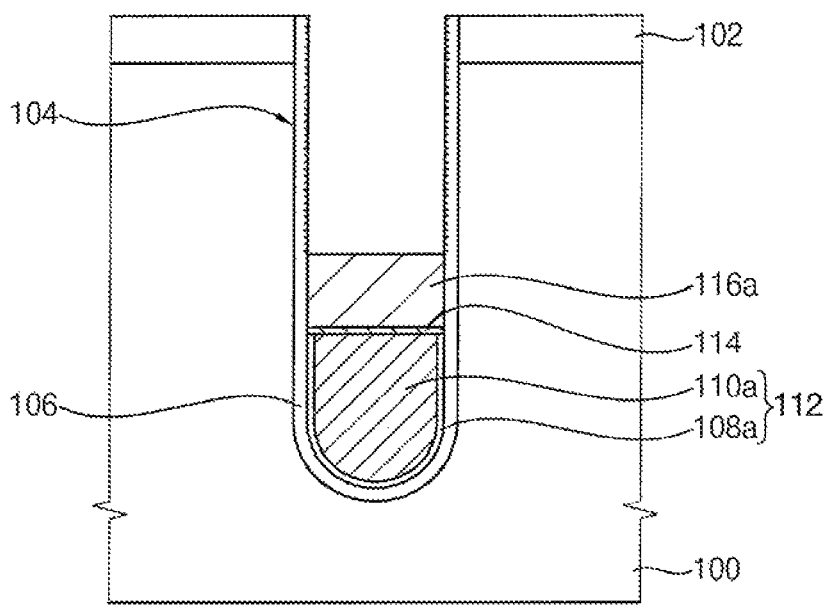

Referring to FIG. 6, the polysilicon layer 116 may be planarized until an upper surface of the hard mask 102 is exposed. The planarization process may include, e.g., a chemical mechanical polishing process. The polysilicon layer 116 at the upper portion of the recess 104 (e.g., proximate to the opening of the recess 104) may be removed by an etch back process.

Thus, a second gate pattern 116a may be formed on the barrier interface layer 114. A sidewall of the second gate pattern 116a may contact (e.g., directly contact) the gate insulation layer 106. The second gate pattern 116a may be formed in the recess 104. An open inner space of the recess 104 may remain above the second gate pattern 116a.

The second gate pattern 116a may have a second height less than the first height (of the first gate pattern 112).

When the etch back process is performed, an exposed surface of the gate insulation layer 106 higher than or above the second gate pattern 116a may be damaged. Thus, a surface damage portion (refer to a dotted line) may be formed at the exposed surface of the gate insulation layer 106.

The surface damage portion of the gate insulation layer 106 may include dangling bonds and particles.

Figure 7:
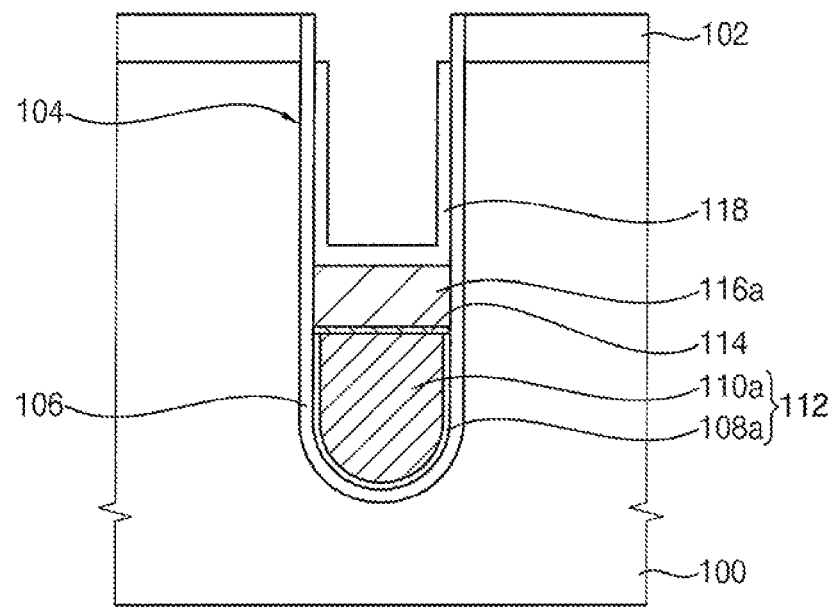
Figure 8:
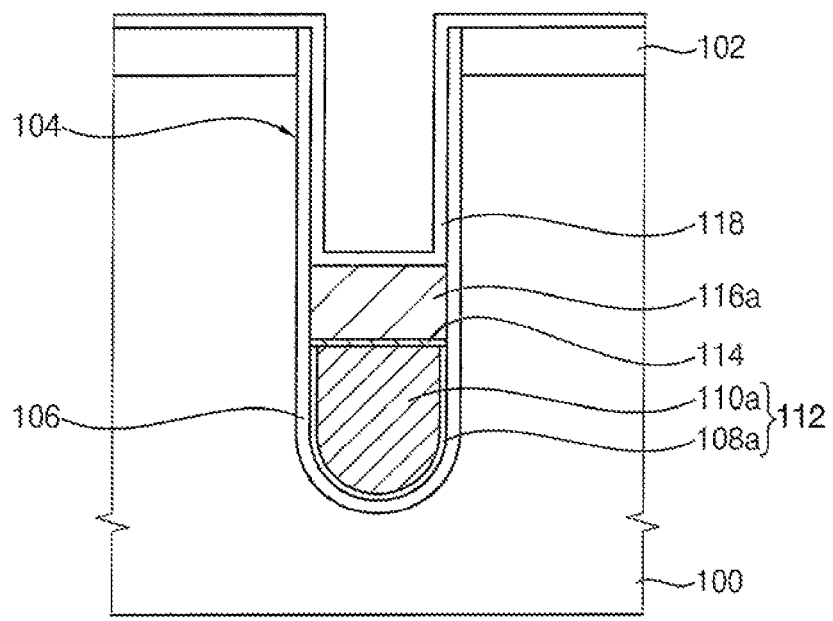

Referring to FIGS. 7 and 8, a surface treatment process for curing the surface damage of the gate insulation layer 106 may be performed. In an implementation, the surface treatment process may include supplying oxygen radicals or oxygen gas. In an implementation, the surface treatment process may include a plasma process using oxygen or ozone. In the surface treatment process, dangling bonds and particles on the surface of the gate insulation layer 106 may be removed by the oxygen.

A leakage blocking oxide layer 118 may be conformally formed on a portion of a surface of the gate insulation layer 106 higher than or above an upper surface of the second gate pattern 116a, and also on the upper surface of the second gate pattern 116a.

In an implementation, the leakage blocking oxide layer 118 may include silicon oxide. In an implementation, the leakage blocking oxide layer 118 may be formed by a thermal oxidation process or a deposition process. The deposition process may include an atomic layer deposition process.

As illustrated in FIG. 7, the leakage blocking oxide layer 118 may be formed by a thermal oxidation process. As illustrated in FIG. 8, the leakage blocking oxide layer 118 may be formed by a deposition process.

In an implementation, the thermal oxidation process may include an In-Situ Steam Generation (ISSG) process, a wet oxidation process, a thermal radical oxidation process, or a plasma oxidation process. In an implementation, the thermal oxidation process may be performed by introducing an oxygen source gas at a high temperature of 800° C. or higher. When the oxidation process is performed at the high temperature, the surface damage portion of the gate insulation layer 106 may be cured by heat.

In an implementation, the deposition process may be formed using a silicon source and an oxygen source at a temperature of about 25° C. to about 600° C. The silicon source may include hexachlorodisilane (HCD), dichlorosilane (DCS), $SiH_4$, $Si_2H_6$, or the like. The oxygen source may include $O_2$, $O_3$, $N_2O$, or a $H_2/O_2$ mixed gas.

As shown in FIG. 7, when the thermal oxidation process is performed, silicon included in the second gate pattern 116a may be oxidized to form a silicon oxide on the upper surface of the second gate pattern 116a. In addition, the silicon oxide may be formed on the gate insulation layer 106 to have a thickness less than a thickness of the silicon oxide on the upper surface of the second gate pattern 116a. Therefore, a thickness of the leakage blocking oxide layer 118 formed on the second gate pattern 116a may be greater than a thickness of the leakage blocking oxide layer 118 formed on the gate insulation layer 106. In addition, an upper portion of the second gate pattern 116a may be transformed to the silicon oxide, and a height of the second gate pattern 116a may be slightly reduced. In an implementation, a portion of the substrate 100 contacting the gate insulation layer 106 at a position higher than the upper surface of the second gate pattern 116a may be consumed by oxidation, so that an upper width of the recess 104 may be slightly increased.

As shown in FIG. 8, when the deposition process is performed, the leakage blocking oxide layer 118 may be formed on surfaces of the gate insulation layer 106, the second gate pattern 116a, and the hard mask 102. In the deposition process, the upper surface of the second gate pattern 116a may be naturally oxidized, so that a native oxide may be additionally formed on the upper surface of the second gate pattern 116a. Thus, a thickness of the leakage blocking oxide layer 118 formed on the second gate pattern 116a may be greater than a thickness of the leakage blocking oxide layer 118 formed on the gate insulation layer 106. In an implementation, a difference between the thickness of the leakage blocking oxide layer 118 on the gate insulation layer 106 and the thickness of the leakage blocking oxide layer 118 on the second gate pattern 116a may not be great. In an implementation, the thickness of the leakage blocking oxide layer 118 on the gate insulation layer 106 and the thickness of the leakage blocking oxide layer 118 on the second gate pattern 116a may be substantially the same.

In an implementation, the leakage blocking oxide layer 118 may include a metal oxide. In this case, the leakage blocking oxide layer 118 may be formed by a deposition process. The deposition process may include an atomic layer deposition process.

In an implementation, the leakage blocking oxide layer 118 may be formed using the heat and the oxygen sources, and surface damage of the gate insulation layer 106 may be cured during forming the leakage blocking oxide layer 118. Thus, the surface damages of the gate insulation layer 106 may be removed during forming the leakage blocking oxide layer 118. In an implementation, the surface treatment process for curing the surface damage of the gate insulation layer 106 may not be performed before forming the leakage blocking oxide layer 118.

Figure 9:
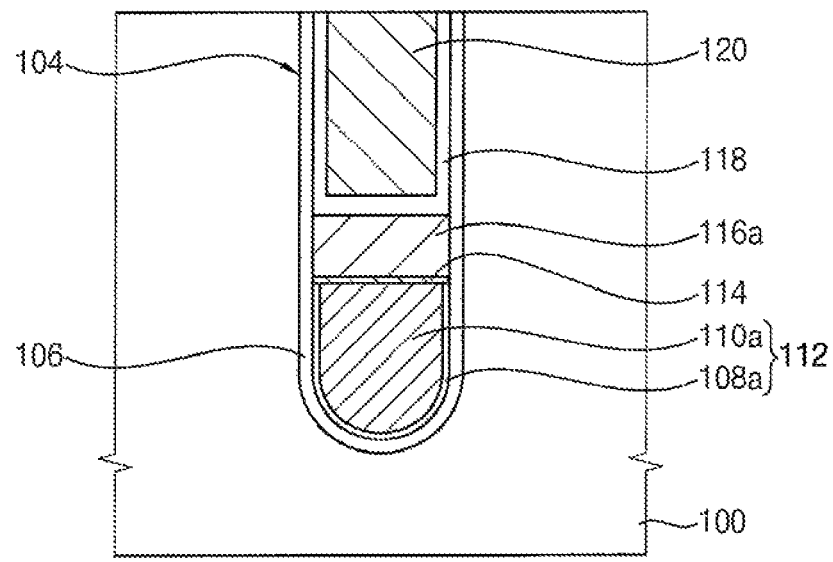

Referring to FIG. 9, a capping insulation layer may be formed on the leakage blocking oxide layer 118 to completely fill (e.g., remaining parts of) the recess 104. Thereafter, upper surfaces of the capping insulation layer and the hard mask 102 may be planarized to form a capping insulation pattern 120. The capping insulation pattern 120 may completely fill the remaining parts of the recess 104.

In the planarization process, the leakage blocking oxide layer 118 on the hard mask 102 may be removed, and most of the hard mask 102 may also be removed. Thereafter, remaining parts of the hard mask 102 may be removed by a cleaning process, and a surface of the substrate 100 may be exposed.

As described above, a gate structure including a gate insulation layer 106, a first gate pattern 112, a barrier interface layer 114, a second gate pattern 116*a*, a leakage blocking oxide layer 118, and a capping insulation pattern may fill the recess 104.

Referring to FIG. 1 again, impurities may be doped on the substrate 100 to form impurity regions 130 at the substrate 100 adjacent to sides of the gate structure. In an implementation, a lower surface of the impurity region 130 may be higher than the upper surface of the first gate pattern 112. In an implementation, a level of the lower surface of the impurity region 130 may be positioned at or adjacent to a portion of a sidewall of the second gate pattern 116*a*, or the lower surface of the impurity region 130 may be higher than an upper surface of the second gate pattern 116*a*.

In an implementation, the doping process for forming the impurity region 130 may be performed, before forming the recess 104 illustrated with reference to FIG. 2.

As described above, the transistor shown in FIG. 1 may be manufactured.

Figure 10:
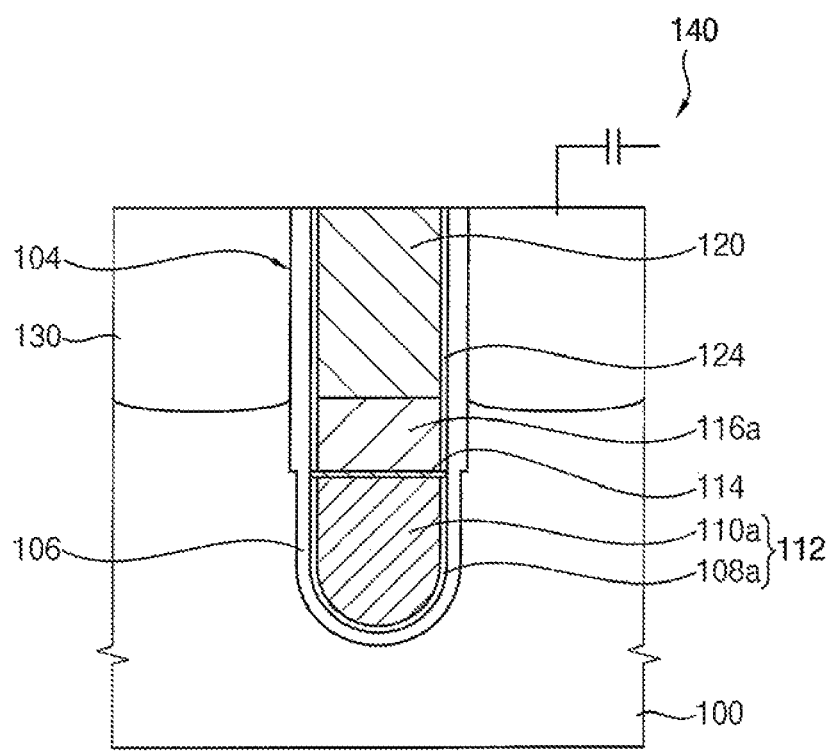
FIG. 10 is a cross-sectional view of a transistor in accordance with example embodiments.

FIG. 10 is a cross-sectional view of a transistor in accordance with example embodiments. The transistor shown in FIG. 10 may be substantially the same as the transistor shown in FIG. 1, except for a leakage blocking oxide layer in a gate structure.

Referring to FIG. 10, the gate insulation layer 106 may be on a sidewall and a bottom surface of the recess 104.

The first gate pattern 112 may be on the gate insulation layer 106 to fill the lower portion of the recess 104. The first gate pattern 112 may include a metal. In an implementation, the first gate pattern 112 may include the barrier metal pattern 108*a* and the metal pattern 110*a*.

In an implementation, the barrier interface layer 114 may be on an upper surface of the first gate pattern 112.

A leakage blocking oxide layer 124 may be on a (e.g., inner) surface of a portion of the gate insulation layer 106 higher than an upper surface of the barrier interface layer 114. In an implementation, the leakage blocking oxide layer 124 may be only on an upper sidewall of the recess 104 (and not on a lower sidewall or bottom of the recess 104). The leakage blocking oxide layer 124 may not be formed on (e.g., central regions of) the upper surface of the barrier interface layer 114.

In an implementation, the leakage blocking oxide layer 124 may include, e.g., silicon oxide.

In an oxidation process for forming the leakage blocking oxide layer 124, the upper sidewall of the recess 104 (e.g., a portion of the substrate 100) may be slightly consumed by the oxidation. Thus, an upper width of the recess 104 may be slightly greater than a lower width of the recess 104.

The second gate pattern 116*a* may be on the barrier interface layer 114. The second gate pattern 116*a* may be substantially the same as the second gate pattern illustrated with reference to FIG. 1.

The capping insulation pattern 120 may be on the second gate pattern 116*a*. The capping insulation pattern 120 may completely fill the remaining parts of the recess 104.

The leakage blocking oxide layer 124 may be on sidewalls of the second gate pattern 116*a* and the capping insulation pattern 120 (e.g., between the second gate pattern 116*a* and the gate insulation layer 106 and between the capping insulation pattern 120 and the gate insulation layer 106).

In an implementation, the gate insulation layer 106 and the leakage blocking oxide layer 124 may be stacked on the sidewalls of the second gate pattern 116*a* and the capping insulation pattern 120. The gate insulation layer 106 may be on the sidewall and bottom surface of the first gate pattern 112. A thickness of a total oxide layer on or at an upper sidewall of the recess 104 (above the first gate pattern 112) may be increased. As the leakage blocking oxide layer 124 is stacked, a thickness of an oxide layer between the maximum electric field portion of the substrate 100 and an upper surface of the second gate pattern 116*a* may be increased. Therefore, an electric field in the substrate may be decreased, and thus GIDL defects of the transistor may be decreased.

As described above, a gate structure including the gate insulation layer 106, the first gate pattern 112, the second gate pattern 116*a*, the barrier interface layer 114, the leakage blocking oxide layer 124, and the capping insulation pattern 120 may be in the recess 104.

The impurity regions 130 serving as source/drain regions may be on the substrate 100 adjacent to sides of the gate structure.

In an implementation, a lower surface of the impurity region 130 may be higher than an upper surface of the first gate pattern 112. In an implementation, a level of the lower surface of the impurity region 130 may be positioned at or adjacent to a portion of the sidewall of the second gate pattern 116*a*, or the lower surface of the impurity region 130 may be higher than an upper surface of the second gate pattern 116*a*.

Figure 11:
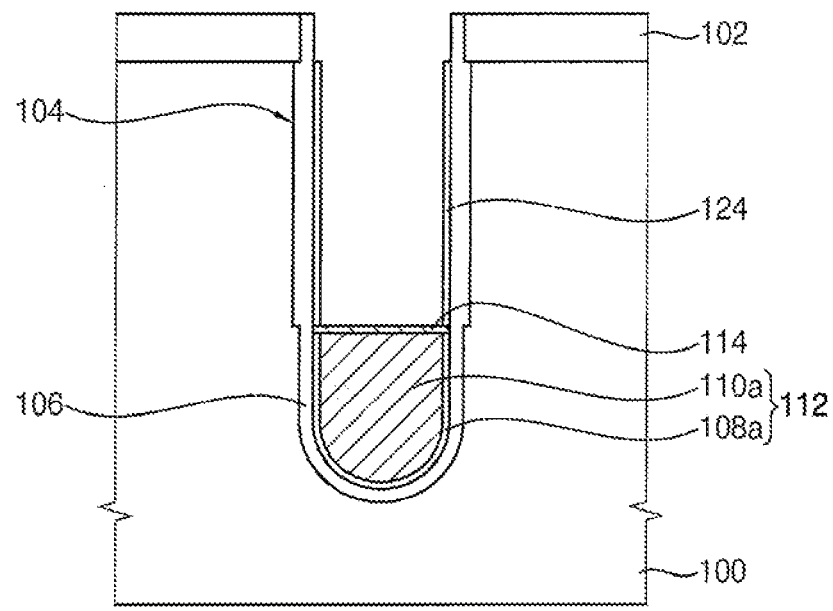
FIGS. 11 to 13 are cross-sectional views of stages in a method of manufacturing a transistor in accordance with example embodiments.
Figure 12:
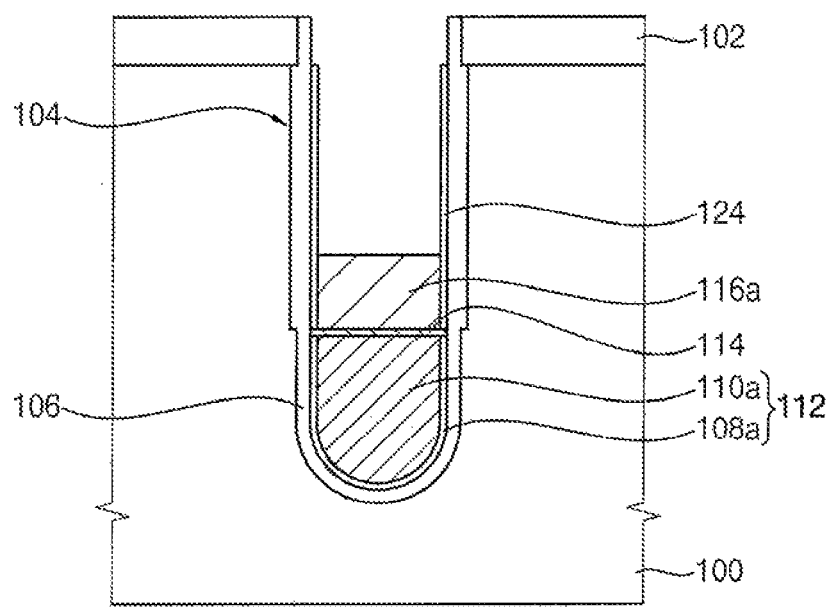
Figure 13:
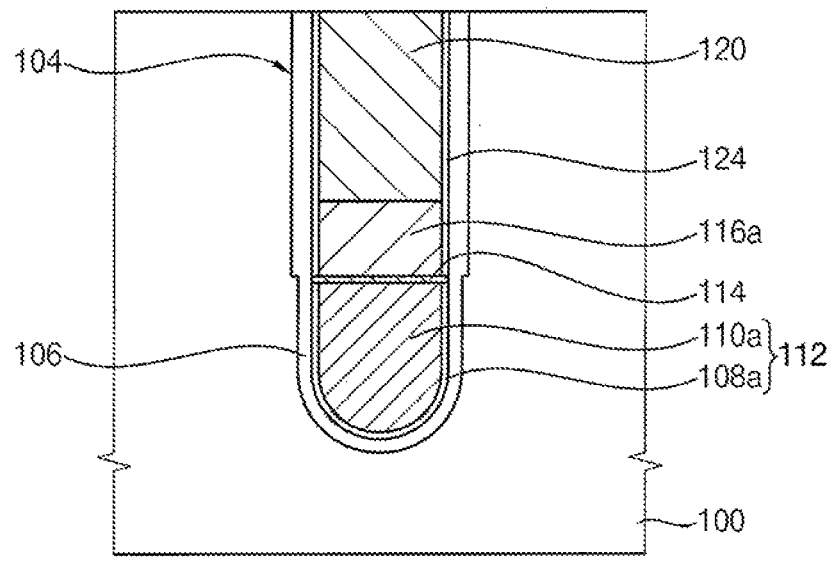

FIGS. 11 to 13 are cross-sectional views of stages in a method of manufacturing a transistor in accordance with example embodiments.

Processes of manufacturing the transistor may be substantially the same as that illustrated with reference to FIGS. 2 to 9, except for a process of forming a leakage blocking oxide layer. Thus, a repeated part may be briefly described or omitted.

Referring to FIG. 11, first, processes illustrated with reference to FIGS. 2 to 4 may be performed to form a structure shown in FIG. 4.

The leakage blocking oxide layer 124 may be selectively formed on a surface of the gate insulation layer 106 higher than an upper surface of the barrier interface layer 114.

In an implementation, the leakage blocking oxide layer 124 may include silicon oxide. The leakage blocking oxide layer 124 may be formed by a thermal oxidation process.

The thermal oxidation process may be performed so that the lower barrier interface layer 114 and the metal pattern 110a may not be oxidized. Thus, the leakage blocking oxide layer 124 may not be formed on the (e.g., inner parts of the upper surface of the) barrier interface layer 114. In an implementation, the thermal oxidation process may include a radical oxidation process using hydrogen and oxygen radicals in a plasma state.

When the thermal oxidation process is performed, a portion of the substrate contacting the gate insulation layer 106 higher than an upper surface of the barrier interface layer 114 may be consumed by oxidation. Thus, an upper width of the recess 104 may be slightly increased.

In the process of forming the leakage blocking oxide layer 124, surface damage of the gate insulation layer 106 may be cured. In an implementation, the surface treatment process for curing the surface damage of the gate insulation layer 106 may not be performed before forming the leakage blocking oxide layer 124.

Referring to FIG. 12, a polysilicon layer doped with impurities may be formed on the barrier interface layer 114 and the hard mask 102 to fill the recess 104. Thereafter, a planarization and an etch back process of the polysilicon layer may be performed to form a second gate pattern 116a on the barrier interface layer 114.

The processes for forming the second gate pattern 116a may be substantially the same as illustrated with reference to FIGS. 5 and 6.

In the etch back process, a surface of the gate insulation layer 106 may be damaged. In an implementation, a surface treatment process for curing the damages of the gate insulation layer 106 may be further performed.

Referring to FIG. 13, a capping insulation layer may be formed on the leakage blocking oxide layer 124 to completely fill the remaining parts of the recess 104. Thereafter, the capping insulation layer may be planarized until an upper surface of the hard mask 102 is exposed to form the capping insulation pattern 120. The capping insulation pattern 120 may completely fill the remaining parts of the recess 104.

As described above, a gate structure including the gate insulation layer 106, the first gate pattern 112, the barrier interface layer 114, the second gate pattern, the leakage blocking oxide layer 124 may formed in the recess 104.

Referring to FIG. 10 again, impurities may be doped on the substrate 100 to form impurity regions 130 at the substrate 100 adjacent to sides of the gate structure.

Thus, the transistor shown in FIG. 10 can be manufactured.

Figure 14:
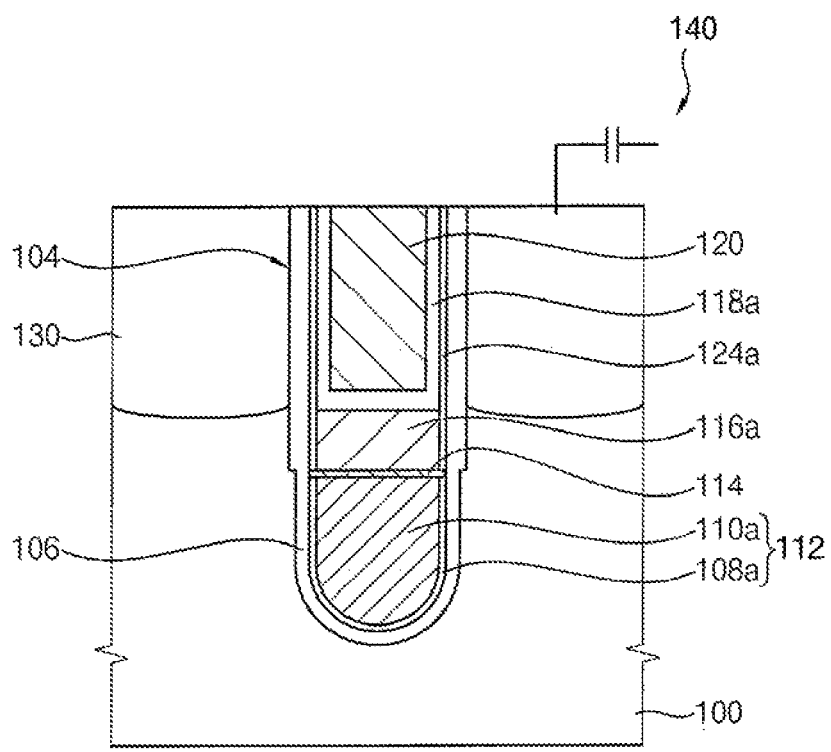
FIG. 14 is a cross-sectional view of a transistor in accordance with example embodiments.

FIG. 14 is a cross-sectional view of a transistor in accordance with example embodiments. The transistor shown in FIG. 14 may be substantially the same as the transistor shown in FIG. 1, except for a leakage blocking oxide layer in a gate structure.

Referring to FIG. 14, the gate insulation layer 106 may be on a sidewall and a bottom surface of the recess 104 of the substrate 100.

The first gate pattern 112 may be on the gate insulation layer 106 to fill a lower portion of the recess 104. In an implementation, the first gate pattern 112 may include the barrier metal pattern 108a and the metal pattern 110a.

In an implementation, the barrier interface layer 114 may be on an upper surface of the first gate pattern 112.

A first leakage blocking oxide layer 124a may be on a surface of a portion of the gate insulation layer 106 higher than the upper surface of the barrier interface layer 114. In an implementation, the first leakage blocking oxide layer 124a may be formed only on an upper sidewall of the recess 104. The first leakage blocking oxide layer 124a may not be formed on (e.g., central portions of the upper surface of) the barrier interface layer 114.

In an implementation, the first leakage blocking oxide layer 124a may include a silicon oxide. In an oxidation process for forming the first leakage blocking oxide layer 124a, the sidewall of the recess 104 (e.g., a part of the substrate 100) may be slightly consumed. An upper sidewall of the recess 104 may be consumed, and an upper width of the recess 104 may be greater than a lower width of the recess 104.

The second gate pattern 116a may be on the barrier interface layer 114. The second gate pattern 116a may be substantially the same as the second gate pattern illustrated with reference to FIG. 1.

A second leakage blocking oxide layer 118a may be on a surface of the first leakage blocking oxide layer 124a higher than an upper surface of the second gate pattern 116a, and also on the upper surface of the second gate pattern 116a.

In an implementation, the second leakage blocking oxide layer 118a may include a silicon oxide. In an implementation, the second leakage blocking oxide layer 118a may include a metal oxide. The metal oxide may include, e.g., hafnium oxide ($HfO_2$), zirconium oxide ($ZrO_2$), aluminum oxide, tantalum oxide, or the like.

In an implementation, a portion of the second leakage blocking oxide layer 118a on the gate insulation layer 106 may have a first thickness, and a portion of the second leakage blocking oxide layer 118a on the second gate pattern 116a may have a second thickness greater than the first thickness.

The capping insulation pattern 120 may be on the second gate pattern 116a. The capping insulation pattern 120 may completely fill remaining parts of the recess 104.

As described above, a gate structure including the gate insulation layer 106, the first gate pattern 112, the second gate pattern 116a, the barrier interface layer 114, the first leakage blocking oxide layer 124a, the second leakage blocking oxide layer 118a and the capping insulation pattern 120 may be formed in the recess 104.

The impurity regions 130 serving as source/drain regions may be formed at the substrate 100 adjacent to sides of the gate structure.

As described above, the first leakage blocking oxide layer 124a may be on the portion of the gate insulation layer 106 higher than or above the first gate pattern 112. In addition, the first and second leakage blocking oxide layers 124a and 118a may be on the portion of the gate insulation layer 106 higher than or above the second gate pattern 116a.

In an implementation, the first and second leakage blocking oxide layers 124a and 118a may be formed, and an electric field in the substrate may be decreased. Thus, GIDL defects of the transistor may be decreased.

Figure 15:
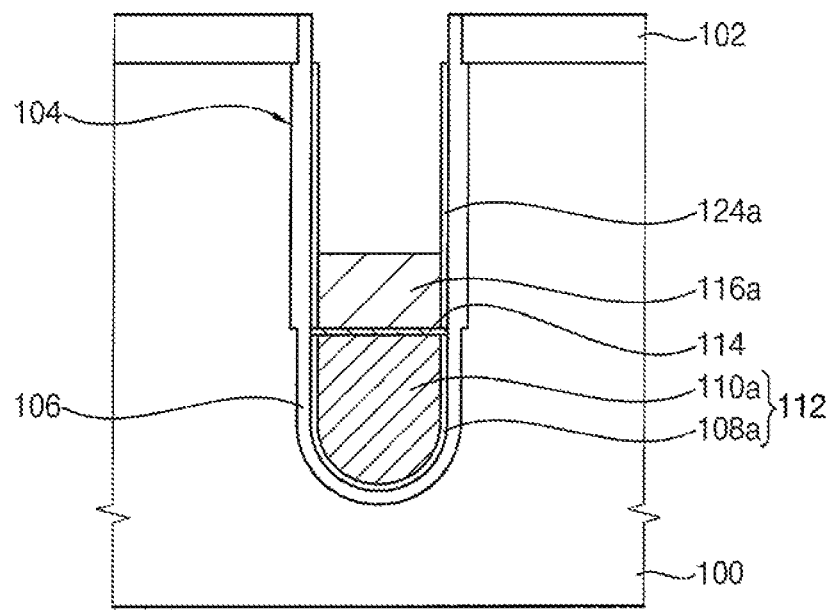
FIGS. 15 to 17 are cross-sectional views of stages in a method of manufacturing a transistor in accordance with example embodiments.
Figure 16:
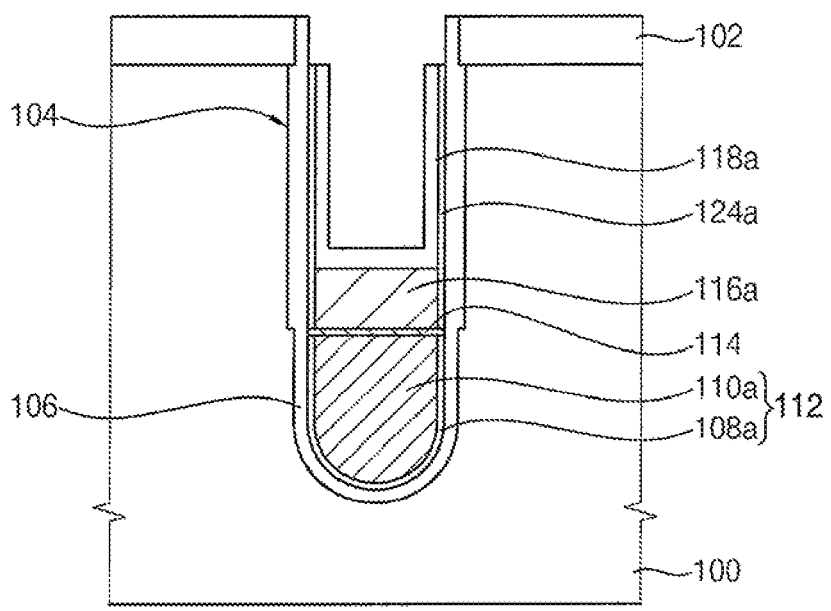
Figure 17:
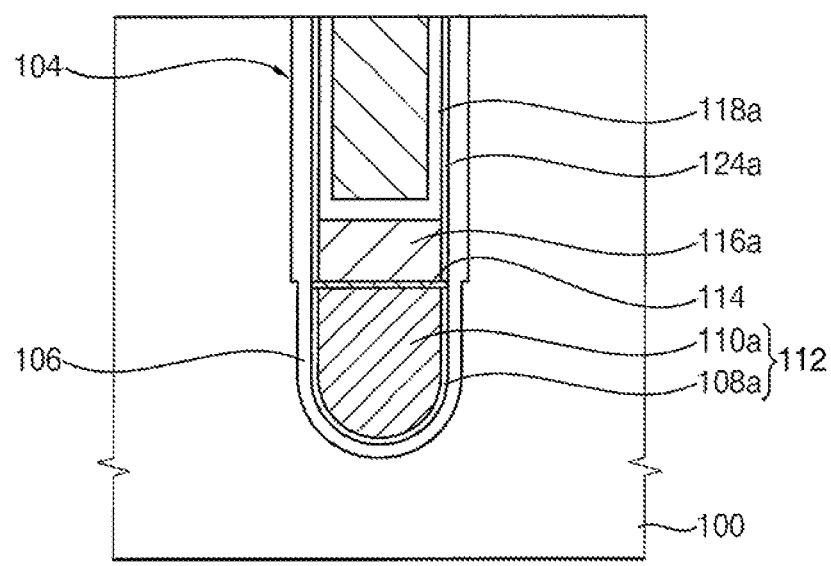

FIGS. 15 to 17 are cross-sectional views of stages in a method of manufacturing a transistor in accordance with example embodiments.

In processes of manufacturing the transistor, processes for forming the first leakage blocking oxide layer may be similar to that illustrated with reference to FIG. 11, and processes for forming the second leakage blocking oxide layer may be similar to that illustrated with reference to FIGS. 7 and 8.

Referring to FIG. 15, first, processes illustrated with reference to FIGS. 2 to 4 may be performed to form a structure shown in FIG. 4.

Thereafter, processes illustrated with reference to FIG. 11 may be performed to form a first leakage blocking oxide layer 124a. The first leakage blocking oxide layer 124a may be selectively formed on a surface of portions of the gate insulation layer 106 higher than an upper surface of the barrier interface layer 114. Subsequently, processes illustrated with reference to FIG. 12 may be performed to form the second gate pattern 116a on the barrier interface layer 114.

Referring to FIG. 16, a second leakage blocking oxide layer 118a may be formed on a surface of portions of the gate insulation layer 106 higher than an upper surface of the second gate pattern 116a, and also on the upper surface of the second gate pattern 116a. The process for forming the second leakage blocking oxide layer 118a may be substantially the same as illustrated with reference to FIGS. 7 and 8.

Referring to FIG. 17, the capping insulation pattern 120 may be formed to completely fill the remaining parts of the recess 104. The processes for forming the capping insulation pattern 120 may be the same as illustrated with reference to FIG. 9.

Thereafter, impurity regions 130 may be formed at the substrate 100 adjacent to sides of the gate structure. Thus, the transistor shown in FIG. 14 may be manufactured.

In the transistors in accordance with example embodiments, a resistance of the gate structure may be decreased, and GIDL defects may be decreased. The transistor may have excellent operating characteristics and electrical characteristics.

Figure 18:
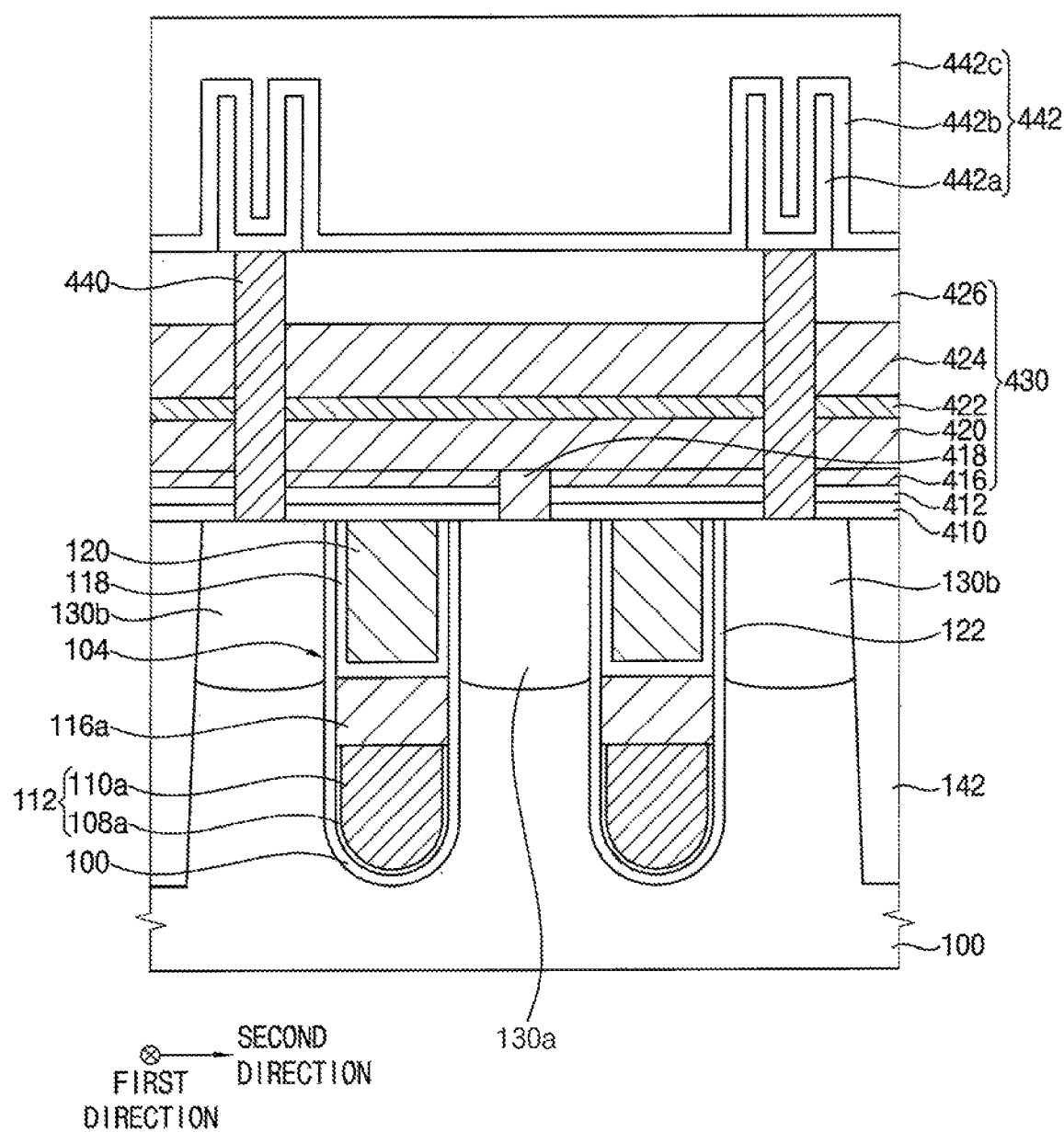
FIG. 18 is a cross-sectional view of a transistor in accordance with example embodiments.

FIG. 18 is a cross-sectional view of a transistor in accordance with example embodiments.

The semiconductor device may be a DRAM device including a transistor in accordance with example embodiments. Therefore, repeated detailed description of the transistor may be omitted.

Referring to FIG. 18, a substrate may include an isolation pattern 142. A region of the isolation pattern 142 may serve as a field region. A region between isolation patterns may serve as an active region.

The substrate may include a first recess 104, and a gate structure may be formed in the first recess 104.

In an implementation, the gate structure may be substantially the same as the gate structure shown in FIG. 1. The gate structure may include the gate insulation layer 106, the first gate pattern 112, the second gate pattern 116a, the barrier interface layer 114, the leakage blocking oxide layer 118, and the capping insulation pattern 120.

In an implementation, the gate structure may be substantially the same as one of the gate structures shown in FIG. 10 or 14.

In an implementation, the gate structure may extend (e.g., lengthwise) in a first direction horizontal to a surface of the substrate 100. A plurality of gate structures may be arranged (e.g., spaced apart) in a second direction horizontal to the surface of the substrate 100 and perpendicular to the first direction.

Impurity regions serving as source/drain regions may be formed at the substrate 100 between the gate structures. In an implementation, the impurity regions may include a first impurity region 130a electrically connected to a bit line structure 430 and a second impurity region 130b electrically connected to a capacitor 442.

A pad pattern 410, a first etch stop pattern 412, and a first conductive pattern 416 may be formed on the active region, the isolation pattern 142 and the gate structure. The pad pattern 410 may include, e.g., an oxide such as silicon oxide, and the first etch stop pattern 412 may include, e.g., a nitride such as silicon nitride. The first conductive pattern 416 may include, e.g., polysilicon doped with impurities.

A second recess may be between stacked structures including the pad pattern 410, the first etch stop pattern 412, and the first conductive pattern 416. The second recess may in the substrate 100 between the gate structures. An upper surface of the first impurity region 130a may be exposed by a bottom surface of the second recess.

A second conductive pattern 418 may be formed in the second recess. The second conductive pattern 418 may include, e.g., polysilicon doped with impurities. The second conductive pattern 418 may contact the first impurity region 130a.

A third conductive pattern 420 may be stacked on the first conductive pattern 416 and the second conductive pattern 418. The third conductive pattern 420 may include, e.g., polysilicon doped with impurities. The first to third conductive patterns 416, 418, and 420 may include substantially the same material, so that the first to third conductive patterns 416, 418, and 420 may be merged into a single structure. A second barrier metal pattern 422, a second metal pattern 424, and a hard mask pattern 426 may be stacked on the third conductive pattern 420.

A stacked structure including the first conductive pattern 416, the second conductive pattern 418, the third conductive pattern 420, the second barrier metal pattern 422, the second metal pattern 424, and the hard mask pattern 426 may serve as a bit line structure 430. In an implementation, the second conductive pattern 418 may serve as a bit line contact, and the first conductive pattern 416, the third conductive pattern 420, the second barrier metal pattern 422 and the second metal pattern 424 may serve as a bit line. The bit line structure 430 may extend in the second direction. A plurality of bit line structures may be arranged in the first direction.

In an implementation, a spacer may be on a sidewall of the bit line structure 430.

A first interlayer insulation layer may fill a space between the bit line structures 430. The first interlayer insulation layer may include silicon oxide.

A contact plug 440 may pass through the first insulating interlayer, the first etch stop pattern 412 and the pad pattern 410. The contact plug 440 may contact the second impurity region 130b. The contact plug 440 may be between the bit line structures 430.

A capacitor 442 may be electrically connected to the contact plug 440. The capacitor 442 may include a lower electrode 442a, a dielectric layer 442b, and an upper electrode 442c stacked. The lower electrode 442a may have a cylindrical shape or a pillar shape.

Memory cells of the DRAM device may include transistors having excellent characteristics. Thus, the memory cell may have excellent operating characteristics and electrical characteristics.

Transistors in accordance with example embodiments may be also used as switching devices of logic devices, flash memory devices, magnetoresistive memory devices, and phase change memory devices.

By way of summation and review, according to a high integration of semiconductor devices, an inner width of a recess may be decreased, and forming of a gate structure in the recess may be difficult. As a width of the gate structure may be decreased, leakage currents in the buried channel array transistor may be increased. Thus, the buried channel array transistor may not exhibit excellent electrical characteristics.

One or more embodiments may provide semiconductor devices including buried channel array transistors.

One or more embodiments may provide a semiconductor device having excellent electrical characteristics.

In example embodiments, the gate structure may have a stacked structure including a first and second gate patterns. Further, the gate structure may include a leakage blocking oxide layer. Thus, a gate induced drain leakage (GIDL) may be decreased in the transistor. The semiconductor device may have excellent electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including a recess;
    a gate insulation layer on a surface of the recess;
    a first gate pattern on the gate insulation layer, the first gate pattern filling a lower portion of the recess;
    a second gate pattern on the first gate pattern in the recess, the second gate pattern including a material having a work function different from a work function of the first gate pattern;
    a barrier interface layer between the first gate pattern and the second gate pattern;
    a capping insulation pattern on the second gate pattern, the capping insulation pattern filling an upper portion of the recess;
    a leakage blocking oxide layer on the gate insulation layer at an upper sidewall of the recess above an upper surface of the first gate pattern, the leakage blocking oxide layer contacting a sidewall of the capping insulation pattern; and
    impurity regions in the substrate and adjacent to the upper sidewall of the recess, each of the impurity regions having a lower surface higher than the upper surface of the first gate pattern,
    wherein:
    the leakage blocking oxide layer includes a silicon oxide,
    the first gate pattern includes a barrier metal pattern contacting the gate insulation layer and a metal pattern on the barrier metal pattern, and
    the barrier interface layer directly contacts the gate insulation layer.

2. The semiconductor device as claimed in claim 1, wherein the leakage blocking oxide layer is on a surface of the gate insulation layer above an upper surface of the second gate pattern, and also on the upper surface of the second gate pattern.

3. The semiconductor device as claimed in claim 2, wherein:
    a first portion of the leakage blocking oxide layer on the surface of the gate insulation layer has a first thickness in a horizontal direction, and
    a second portion of the leakage blocking oxide layer on the upper surface of the second gate pattern has a second thickness in a vertical direction, the second thickness being greater than the first thickness.

4. The semiconductor device of claim 1, wherein the leakage blocking oxide layer is only on a surface of a portion of the gate insulation layer above an upper surface of the first gate pattern.

5. The semiconductor device as claimed in claim 1, wherein:
    the leakage blocking oxide layer includes a first leakage blocking oxide layer and a second leakage blocking oxide layer,
    the first leakage blocking oxide layer is on a surface of a portion of the gate insulation layer above the upper surface of the first gate pattern, and
    the second leakage blocking oxide layer is on a surface of a portion of the first leakage blocking oxide layer above an upper surface of the second gate pattern, and also on the upper surface of the second gate pattern.

6. The semiconductor device as claimed in claim 1, wherein the metal pattern includes tungsten.

7. The semiconductor device as claimed in claim 1, wherein a difference between the work function of the second gate pattern and a work function of the impurity region is less than a difference between the work function of the first gate pattern and a work function of the impurity region.

8. The semiconductor device as claimed in claim 1, wherein the second gate pattern includes polysilicon doped with impurities.

9. The semiconductor device as claimed in claim 1, wherein the barrier interface layer includes a nitride of a metal material included in the first gate pattern.

10. A semiconductor device, comprising:
    a substrate including a recess;
    a gate insulation layer on a surface of the recess;
    a first gate pattern on the gate insulation layer, the first gate pattern filling a lower portion of the recess;
    a second gate pattern on the first gate pattern in the recess, the second gate pattern including polysilicon doped with impurities;
    a barrier interface layer between the first gate pattern and the second gate pattern;
    a leakage blocking oxide layer on a portion of the gate insulation layer above an upper surface of the second gate pattern, and also on the upper surface of the second gate pattern;
    a capping insulation pattern on the leakage blocking oxide layer, the capping insulation pattern consisting of silicon nitride and completely filling an upper portion of the recess; and
    impurity regions in the substrate adjacent to an upper sidewall of the recess, each of the impurity regions having a lower surface higher than an upper surface of the first gate pattern,
    wherein:
    the leakage blocking oxide layer includes a silicon oxide,
    the first gate pattern includes a barrier metal pattern contacting the gate insulation layer and a metal pattern on the barrier metal pattern, and
    the barrier interface layer directly contacts the gate insulation layer.

11. The semiconductor device as claimed in claim 10, wherein:
    a first portion of the leakage blocking oxide layer on a surface of the gate insulation layer has a first thickness in a horizontal direction, and
    a second portion of the leakage blocking oxide layer on the upper surface of the second gate pattern has a second thickness in a vertical direction, the second thickness being greater than the first thickness.

12. The semiconductor device as claimed in claim 10, further comprising an additional leakage blocking layer between the leakage blocking oxide layer and the gate insulation layer, the additional leakage blocking layer being on a surface of a portion of the gate insulation layer above the upper surface of the first gate pattern.

13. A semiconductor device, comprising:
a substrate including an isolation region and an active region;
a recess in the substrate, and the recess extending in a first direction;
a gate insulation layer on a surface of the recess;
a first gate pattern on the gate insulation layer, the first gate pattern filling a lower portion of the recess;
a second gate pattern on the first gate pattern in the recess, the second gate pattern including a material having a work function different from a work function of the first gate pattern;
a barrier interface layer between the first gate pattern and the second gate pattern;
a capping insulation pattern on the second gate pattern, the capping insulation pattern consisting of silicon nitride and completely filling an upper portion of the recess;
a leakage blocking oxide layer on a portion of the gate insulation layer on an upper sidewall of the recess above an upper surface of the first gate pattern, the leakage blocking oxide layer contacting at least a sidewall of the capping insulation pattern;
a first impurity region and a second impurity region in the substrate adjacent to the upper sidewall of the recess, each of the first and second impurity regions having a lower surface higher than the upper surface of the first gate pattern;
a bit line structure electrically connected to the first impurity region; and
a capacitor electrically connected to the second impurity region,
wherein:
the leakage blocking oxide layer includes a silicon oxide,
the first gate pattern includes a barrier metal pattern contacting the gate insulation layer and a metal pattern on the barrier metal pattern, and
the barrier interface layer directly contacts the gate insulation layer.

14. The semiconductor device as claimed in claim 13, wherein a difference between the work function of the second gate pattern and a work function of each of the first and second impurity regions is less than a difference between the work function of the first gate pattern and a work function of each of the first and second impurity regions.

* * * * *